(12) United States Patent
Bosman et al.

(10) Patent No.: US 11,581,502 B2
(45) Date of Patent: Feb. 14, 2023

(54) METHOD OF MAKING A CURRENT COLLECTING GRID FOR SOLAR CELLS

(71) Applicant: Stichting Energieonderzoek Centrum Nederland, Petten (NL)

(72) Inventors: Johan Bosman, Petten (NL); Tristram Budel, Petten (NL)

(73) Assignee: Nederlandse Organisatie voortoegepast-natuurwetenschappelijk Onderzoek TNO, 's Gravenhage (NL)

( * ) Notice: Subject to any disclaimer, the term of this patent is extended or adjusted under 35 U.S.C. 154(b) by 0 days.

(21) Appl. No.: 15/535,415

(22) PCT Filed: Dec. 17, 2015

(86) PCT No.: PCT/NL2015/050877
§ 371 (c)(1),
(2) Date: Jun. 13, 2017

(87) PCT Pub. No.: WO2016/105186
PCT Pub. Date: Jun. 30, 2016

(65) Prior Publication Data
US 2017/0373262 A1   Dec. 28, 2017

(30) Foreign Application Priority Data
Dec. 23, 2014  (NL) .................................... 2014040

(51) Int. Cl.
*H01L 51/44* (2006.01)
*H01L 51/00* (2006.01)
(Continued)

(52) U.S. Cl.
CPC .......... *H01L 51/445* (2013.01); *H01L 27/301* (2013.01); *H01L 31/022433* (2013.01);
(Continued)

(58) Field of Classification Search
CPC ............ H01L 27/301; H01L 31/022433; H01L 31/022441; H01L 51/0097; H01L 51/445
(Continued)

(56) References Cited

U.S. PATENT DOCUMENTS 4,243,432 A * 1/1981 Jordan .............. H01L 31/03365
136/244
4,315,096 A * 2/1982 Tyan ...................... H01L 31/046
136/244
(Continued)

FOREIGN PATENT DOCUMENTS

DE  102012109777 A1  4/2014
FR  2954856 A1  7/2011
(Continued)

OTHER PUBLICATIONS

Burgers A R et al: Metallisation patterns for interconnection through holes, S0lar Energy Materials and S0lar Cells, Elsevier Science Publishers, Amsterdam, NL, vol. 65, No. 1-4, Jan. 1, 2001 (Jan. 1, 2001), pp. 347-353, XP004217137, ISSN: 0927-0248, DOI: 10.1016/S0927-0248(00)00112-4 the whole document.

(Continued)

*Primary Examiner* — Jay C Kim
(74) *Attorney, Agent, or Firm* — N.V. Nederlandsch Octrooibureau

(57) ABSTRACT

Method of making a current collecting grid for solar cells, including the steps of
a) providing a continuous layer stack (1) on a substrate (8), the layer stack (1) including an upper (2) and a lower (3) conductive layer having a photoactive layer (4) interposed there between;
b) selectively removing the upper conductive layer (2) and the photoactive layer (4) for obtaining a first contact hole (10) extending through the upper conduc-
(Continued)

Figure 1:
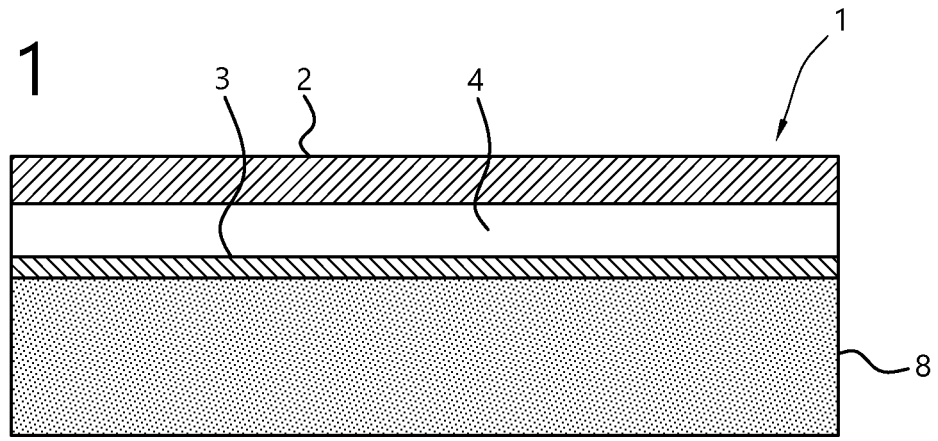

tive layer (2) and photoactive layer (4) exposing the lower conductive layer (3);

c) printing a front contact body (4) on the upper conductive layer (2) and a back contact body (5) in the first contact hole (10) on the lower conductive layer (3) and forming an electrically insulating first gap surrounding the back contact body (5) between the upper conductive layer (2) and the back contact body (2).

13 Claims, 4 Drawing Sheets

(51) Int. Cl.
*H01L 31/0224* (2006.01)
*H01L 27/30* (2006.01)
*H01L 31/0465* (2014.01)

(52) U.S. Cl.
CPC .. *H01L 31/022441* (2013.01); *H01L 31/0465* (2014.12); *H01L 51/0097* (2013.01); *H01L 51/0022* (2013.01); *H01L 51/0037* (2013.01); *Y02E 10/549* (2013.01); *Y02P 70/50* (2015.11)

(58) Field of Classification Search
USPC .......................................................... 257/466
See application file for complete search history.

(56) References Cited

U.S. PATENT DOCUMENTS

| | | | | |
|---|---|---|---|---|
| 4,667,058 A * | 5/1987 | Catalano | H01L 21/764 | 136/244 |
| 4,668,840 A * | 5/1987 | Kiyama | H01L 31/202 | 136/244 |
| 4,697,041 A * | 9/1987 | Okaniwa | H01L 31/022425 | 136/244 |
| 4,726,849 A * | 2/1988 | Murata | H01L 31/03921 | 136/244 |
| 4,758,526 A * | 7/1988 | Thalheimer | H01L 31/046 | 136/244 |
| 4,872,925 A * | 10/1989 | McMaster | H01L 31/022425 | 136/244 |
| 4,948,436 A * | 8/1990 | Juergens | H01L 31/076 | 136/244 |
| 5,131,954 A * | 7/1992 | Vogeli | H01L 31/0236 | 136/244 |
| 5,322,572 A * | 6/1994 | Wanlass | H01L 31/03046 | 136/246 |
| 5,348,589 A * | 9/1994 | Arai | H01L 31/03921 | 136/244 |
| 5,385,848 A * | 1/1995 | Grimmer | H01L 31/03921 | 136/244 |
| 5,538,902 A * | 7/1996 | Izu | H01L 31/0352 | 136/244 |
| 5,578,502 A * | 11/1996 | Albright | H01L 31/022425 | 257/E27.125 |
| 5,637,156 A * | 6/1997 | Kubota | H01L 31/048 | 136/251 |
| 5,716,459 A * | 2/1998 | Chang | H01L 31/035272 | 136/249 |
| 5,994,642 A * | 11/1999 | Higuchi | C23C 14/0629 | 136/260 |
| 6,040,520 A * | 3/2000 | Morooka | H01L 31/03921 | 136/245 |
| 6,184,057 B1 * | 2/2001 | Van Andel | H01L 31/022466 | 136/244 |
| 6,265,652 B1 * | 7/2001 | Kurata | H01L 31/046 | 136/244 |
| 6,274,804 B1 * | 8/2001 | Psyk | H01L 27/1421 | 136/244 |
| 6,300,556 B1 * | 10/2001 | Yamagishi | H01L 31/048 | 136/251 |
| 6,300,593 B1 * | 10/2001 | Powell | B23K 26/0846 | 219/121.67 |
| 6,323,056 B1 * | 11/2001 | Miyoshi | H01L 31/046 | 136/244 |
| 6,426,235 B1 * | 7/2002 | Matsushita | H01L 31/0682 | 438/960 |
| 6,468,828 B1 * | 10/2002 | Glatfelter | H01L 31/02168 | 136/244 |
| 6,521,823 B2 * | 2/2003 | Kubota | H01L 31/048 | 136/244 |
| 6,525,264 B2 * | 2/2003 | Ouchida | H01L 31/03767 | 136/244 |
| 6,559,411 B2 * | 5/2003 | Borgeson | B23K 26/0838 | 219/121.69 |
| 6,566,159 B2 * | 5/2003 | Sawada | H01L 31/076 | 438/485 |
| 6,573,445 B1 * | 6/2003 | Burgers | H01L 31/022433 | 136/244 |
| 6,578,764 B1 * | 6/2003 | Hiraishi | H01L 23/544 | 235/454 |
| 6,632,993 B2 * | 10/2003 | Hayashi | H01L 31/0236 | 136/244 |
| 6,653,550 B2 * | 11/2003 | Hayashi | H01L 31/076 | 136/244 |
| 6,706,963 B2 * | 3/2004 | Gaudiana | H01G 9/2031 | 136/244 |
| 6,870,088 B2 * | 3/2005 | Tachibana | H01L 31/076 | 136/244 |
| 7,052,998 B2 * | 5/2006 | Shinohara | H01L 31/03921 | 438/702 |
| 7,199,395 B2 * | 4/2007 | Terakawa | H01L 31/022441 | 257/52 |
| 7,276,658 B2 * | 10/2007 | Dubbeldam | H01L 31/1896 | 136/244 |
| 7,276,724 B2 * | 10/2007 | Sheats | H01L 31/0392 | 257/21 |
| 7,547,569 B2 * | 6/2009 | Weidman | H01L 31/0749 | 438/102 |
| 7,547,570 B2 * | 6/2009 | Borden | H01L 31/0322 | 216/18 |
| 7,638,707 B2 * | 12/2009 | Shinohara | H01L 31/076 | 136/244 |
| 7,732,229 B2 * | 6/2010 | Leidholm | B82Y 10/00 | 257/21 |
| 7,994,418 B2 * | 8/2011 | Tandon | H01L 31/022425 | 136/244 |
| 8,129,658 B2 * | 3/2012 | Manens | B23K 26/0673 | 219/121.72 |
| 8,134,067 B1 * | 3/2012 | Tsai | H01L 31/0465 | 136/249 |
| 8,198,117 B2 * | 6/2012 | Leidholm | B82Y 10/00 | 136/260 |
| 8,207,442 B2 * | 6/2012 | Woods | H01L 31/03921 | 136/255 |
| 8,247,243 B2 * | 8/2012 | Sheats | H01L 31/022441 | 257/21 |
| 8,273,597 B2 * | 9/2012 | Wang | H01L 31/022425 | 136/244 |
| 8,298,852 B2 * | 10/2012 | Shin | H01L 31/022425 | 136/244 |
| 8,309,390 B2 * | 11/2012 | Lerchenberger | B08B 7/0042 | 438/85 |
| 8,329,494 B2 * | 12/2012 | Denda | H01L 31/022425 | 136/244 |
| 8,362,354 B2 * | 1/2013 | Shinohara | H01L 31/0463 | 136/244 |
| 8,445,310 B2 * | 5/2013 | Bi | H01L 31/02168 | 136/244 |
| 8,445,315 B2 * | 5/2013 | Uchida | H01L 31/0392 | 136/244 |
| 8,455,753 B2 * | 6/2013 | Nishi | G04C 10/02 | 136/252 |
| 8,552,287 B2 * | 10/2013 | Lu | H01L 31/022425 | 136/256 |
| 8,569,094 B2 * | 10/2013 | Stolt | H01L 31/046 | 257/E31.11 |

(56) References Cited

U.S. PATENT DOCUMENTS

| | | | | |
|---|---|---|---|---|
| 8,592,248 B2* | 11/2013 | Cheng | H01L 31/0463 | 438/57 |
| 8,686,282 B2* | 4/2014 | McGlynn | H01L 31/0422 | 136/252 |
| 8,716,591 B2* | 5/2014 | Misra | H01L 31/1876 | 136/249 |
| 8,729,383 B2* | 5/2014 | Lu | H01L 31/046 | 136/244 |
| 8,742,247 B2* | 6/2014 | Kang | H01L 31/1804 | 136/244 |
| 8,779,282 B2* | 7/2014 | Kwon | H01L 31/022425 | 136/252 |
| 8,822,809 B2* | 9/2014 | Kwon | H01L 31/022425 | 136/244 |
| 8,846,419 B2* | 9/2014 | Stein | H01L 31/046 | 438/19 |
| 8,865,569 B2* | 10/2014 | Brunton | B23K 26/0604 | 438/463 |
| 8,876,963 B2* | 11/2014 | Cruz | H01L 31/022441 | 106/287.18 |
| 8,884,153 B2* | 11/2014 | Yamaguchi | H01L 31/05 | 136/244 |
| 8,884,154 B2* | 11/2014 | Stangl | H01L 31/022425 | 136/244 |
| 8,889,470 B2* | 11/2014 | Kim | H01L 31/05 | 136/252 |
| 8,895,845 B2* | 11/2014 | Kizilyalli | H01L 31/0304 | 136/262 |
| 8,927,315 B1* | 1/2015 | Sheats | H01L 31/042 | 438/57 |
| 9,029,680 B2* | 5/2015 | Kizilyalli | H01L 31/0516 | 136/244 |
| 9,029,687 B2* | 5/2015 | Kizilyalli | H01L 31/0304 | 136/255 |
| 9,059,347 B2* | 6/2015 | Nishi | H01L 31/1816 | |
| 9,130,102 B2* | 9/2015 | Myong | H01L 31/0687 | |
| 9,166,089 B2* | 10/2015 | Yoshikawa | H01L 31/0465 | |
| 9,178,086 B2* | 11/2015 | Hu | H01L 31/022441 | |
| 9,269,841 B2* | 2/2016 | Morimoto | H01L 31/022425 | |
| 9,306,093 B2* | 4/2016 | Baird | B23K 26/0732 | |
| 9,391,219 B2* | 7/2016 | Kim | H01L 31/0463 | |
| 9,401,440 B2* | 7/2016 | Han | H01L 31/02167 | |
| 9,412,894 B2* | 8/2016 | Song | H01L 31/202 | |
| 9,496,513 B2* | 11/2016 | Aoki | H01L 51/4253 | |
| 9,502,591 B2* | 11/2016 | Cho | H01L 31/022425 | |
| 9,553,213 B2* | 1/2017 | Shin | H01L 27/302 | |
| 9,595,913 B2* | 3/2017 | Park | H01L 31/0201 | |
| 9,711,669 B2* | 7/2017 | Tokioka | H01L 31/02366 | |
| 9,741,884 B2* | 8/2017 | Kim | H01L 31/0749 | |
| 9,748,424 B2* | 8/2017 | Lee | H01L 31/0465 | |
| 9,786,800 B2* | 10/2017 | Hahn | H01L 31/022425 | |
| 9,806,207 B2* | 10/2017 | Kwon | H01L 31/0463 | |
| 9,812,593 B2* | 11/2017 | Park | H01L 31/022425 | |
| 9,818,897 B2* | 11/2017 | Lee | H01L 31/03923 | |
| 9,911,881 B2* | 3/2018 | Pfeiffer | H01L 31/022433 | |
| 9,954,122 B2* | 4/2018 | Lim | H01L 31/022425 | |
| 10,090,431 B2* | 10/2018 | Cheng | H01L 31/0296 | |
| 10,134,932 B2* | 11/2018 | Lee | H01L 31/0465 | |
| 10,181,541 B2* | 1/2019 | Moslehi | H01L 31/0475 | |
| 2005/0253142 A1* | 11/2005 | Negami | H01L 31/046 | 257/65 |
| 2006/0266409 A1* | 11/2006 | Takeda | H01L 31/022425 | 136/252 |
| 2007/0079866 A1* | 4/2007 | Borden | H01L 31/046 | 136/252 |
| 2008/0115821 A1* | 5/2008 | Xu | H01L 31/022425 | 136/244 |
| 2009/0032094 A1* | 2/2009 | Aoki | H01L 31/0322 | 136/256 |
| 2009/0084425 A1* | 4/2009 | Milshtein | H01L 31/072 | 136/244 |
| 2009/0229653 A1* | 9/2009 | Lu | H01L 31/022425 | 136/249 |
| 2009/0320895 A1* | 12/2009 | Yagiura | H01L 31/0465 | 136/244 |
| 2010/0132780 A1* | 6/2010 | Kizilyalli | H01L 31/02363 | 136/255 |
| 2011/0011437 A1* | 1/2011 | Denda | H01L 31/022425 | 136/244 |
| 2011/0041890 A1* | 2/2011 | Sheats | H01L 31/0463 | 136/244 |
| 2012/0138126 A1* | 6/2012 | Yata | H01L 31/022466 | 136/249 |
| 2012/0186634 A1* | 7/2012 | Jee | H01L 31/0749 | 136/252 |
| 2012/0240971 A1* | 9/2012 | Telle | H05K 1/189 | 136/244 |
| 2012/0325309 A1* | 12/2012 | Takahama | H01L 31/0747 | 438/57 |
| 2013/0000722 A1* | 1/2013 | Yamada | H01L 31/02363 | 136/256 |
| 2014/0230885 A1* | 8/2014 | Fyson | G08B 13/1409 | 136/251 |
| 2014/0318614 A1* | 10/2014 | Von Campe | H01L 31/02008 | 136/256 |
| 2015/0194552 A1* | 7/2015 | Ogasahara | H01L 31/022433 | 136/256 |

FOREIGN PATENT DOCUMENTS

| | | | | |
|---|---|---|---|---|
| JP | WO 2014/136359 | * | 9/2014 | H01L 51/44 |
| WO | 2013/039019 A1 | | 3/2013 | |
| WO | WO 2013/058522 | * | 4/2013 | H01L 31/042 |

OTHER PUBLICATIONS

Takayuki Kuwabara et al: Development of bifacial inverted polymer solar cells using a conductivity-controlled transparent PEDOTiPSS and a striped Au electrode on the hole collection side, Japanese J0urnal 0f Applied Physics, Japan Society of Applied Physics, JP, vol. 53, No. 2S, Feb. 1, 2014 (Feb. 1, 2014), pp. 2BE07-1, XP001588357, ISSN: 0021-4922, DOI: 10.7567/JJAP.53.O2BE07 [retrieved on Jan. 29, 2014] the whole document.

\* cited by examiner

METHOD OF MAKING A CURRENT COLLECTING GRID FOR SOLAR CELLS

FIELD OF THE INVENTION

The present invention relates to a method of making a current collecting grid for solar cells, in particular making front and back contacts for the solar cells. In a further aspect the present invention relates to a thin film polymer or organic solar cell.

PRIOR ART

Yulia Galagan et al., "ITO-free flexible organic solar cells with printed current collecting grids", Solar Energy Materials and Solar Cells 95 (5), 1339-1343, (2011), discloses a printed current collecting grid comprising silver, wherein the current collecting grid is buried within a barrier layer underneath a conductive layer made of PEDOT:PSS.

SUMMARY OF THE INVENTION

The present invention seeks to provide an improved method of making a current collecting grid for solar cells, wherein the current collecting grid can be manufactured in one single manufacturing step as a last step of the manufacturing process. The method is suitable for large area, high yield, solution based roll-to-roll (R2R) production techniques, such as for manufacturing thin film organic solar cells. Further advantages of the method are that alignment requirements are less critical and solar cell geometry can be chosen freely.

According to the present invention, the method of making a current collecting grid comprises the steps of a) providing a continuous layer stack on a substrate, the layer stack comprising an upper and a lower conductive layer having a photoactive layer interposed there between;

b) selectively removing the upper conductive layer and the photoactive layer for obtaining a first contact hole extending through the upper conductive layer and photoactive layer exposing the lower conductive layer;

c) printing a front contact body on the upper conductive layer and a back contact body in the first contact hole on the lower conductive layer and forming an electrically insulating first gap surrounding the back contact body between the upper conductive layer and the back contact body.

The method of the present invention has the advantage to allow deposition of a current collecting grid once a layer stack has been manufactured, so that manufacturing a layer stack and a current collecting grid are non-overlapping, separated manufacturing phases. This greatly simplifies the overall production process of solar cells as production requirements of the current collecting grid do not interfere with various processing requirements of the layer stack.

Another advantage of the method is that depositing the current collecting grid can be performed from one side of the layer stack, thereby simplifying an automated depositing step for the current collecting grid. Furthermore, external electrical connections to the solar cells, such as external wiring, can be obtained by immediately providing the current collecting grid with electrical contact pads once the current collecting grid has been deposited.

In an embodiment, the method step of c) comprises printing the front and back contact from one side of the layer stack, thereby facilitating an automated manufacturing process as only one side of the layer stack needs to be accessible.

In another embodiment, which greatly increases manufacturing speed, the step of c) may comprise printing the front and back contact body simultaneously.

According to the invention, various embodiments exist that are configured to allow for misalignment or an alignment offset of the back contact body with respect to the first contact hole. To that end, the method step of b) may comprises further selectively removing the upper conductive layer for widening, e.g. locally widening, the first contact hole therein. By widening the first contact hole locally in e.g. the upper conductive layer, a larger alignment offset of the back contact body can be accepted without risking direct contact between the back contact body and the upper conductive layer.

In an embodiment, the method step of b) may further comprise selectively removing the lower conductive layer for extending the first contact hole there through, which allows for improved adhesion of the back contact body to the layer stack, in particular to the substrate and the lower conductive layer.

In a further embodiment, a main part of the first contact hole extending through the upper conductive layer and the photoactive layer is wider than a secondary part of the first contact hole extending through the lower conductive layer. This is an embodiment wherein the first contact hole extends through the lower conductive layer but with a reduced width, diameter etc., so that adhesion of the back contact body to the layer stack is improved and electrical conductivity between the back contact body and lower conductive layer is maintained.

Further alignment offset issues of the back contact body may be addressed by the method of the present invention, wherein the method step of b) may further comprise selectively removing the upper conductive layer and the photoactive layer for obtaining a second contact hole adjacent to the first contact hole. This alternative embodiment further prevents direct contact between the back contact body and the upper conductive layer for larger alignment offsets of the back contact body.

In an embodiment, the method step of b) may further comprises selectively removing the upper conductive layer for obtaining an electrically insulating second gap surrounding the second contact hole, wherein the electrically insulating second gap extends through the upper conductive layer exposing the photoactive layer. This embodiment also provides a further electrical insulating barrier between the back contact body and the upper conductive layer should the alignment offset be relatively large.

From a manufacturing point of view, in particular with respect to manufacturing speed, the step of c) may further comprise forming the front and back contact body to equal height and/or equal width, which facilitates simultaneously depositing the front and back contact body.

In an embodiment, the method step of c) may further comprise printing the back contact body such that it extends above the upper conductive layer, thereby improving accessibility of the back contact body for further electrical connections.

In an embodiment, the method step of b) selectively removing the upper conductive layer and the photoactive layer may comprise selective laser ablation, whereby various shapes can be readily provided with relatively high scribing speeds.

In another embodiment, the method step of c) may comprise screen printing or inkjet printing the front and/or back contact body. Screen printing and inkjet printing are readily scalable printing techniques suitable for roll-to-roll manufacturing.

In yet another embodiment, the method step of c) may comprise printing the front and back contact using a printing compound comprising at least one of silver, carbon and carbon nanotubes. The printing compound may also comprise copper and aluminium.

Each of the upper and lower conductive layer may comprise a conductive polymer, and wherein the photoactive layer may comprise organic material and/or perovskite.

In light of the present invention, the substrate may comprise a flexible substrate comprising a plastic foil for facilitating roll-to-roll manufacturing.

In a further aspect the present invention relates to a thin film polymer or organic solar cell having good performance and efficiency. The solar cell according to the invention comprises a layer stack disposed on a flexible substrate, the layer stack comprising an upper and a lower conductive layer having a photoactive layer interposed there between;
a first contact hole in the layer stack extending through the upper conductive layer and photoactive layer; and a current collecting grid comprising
a front contact body disposed on the upper conductive layer and a back contact body disposed on the lower conductive layer in the first contact hole, wherein an electrically insulating gap surrounds the first contact hole between the upper conductive layer and the contact hole.

In an embodiment, the front contact body and the back contact body are of equal width and/or height, which improves the efficiency and performance of the current collecting grid and ultimately the solar cell.

In another embodiment, the solar cell may comprise a second contact hole adjacent to the first contact hole, wherein the second contact hole extends through the upper conductive layer and the photoactive layer. This embodiment provides a further electrically insulating gap between the back contact body and the upper conductive layer for preventing direct contact there between. Generally speaking, the thin film organic solar cell may comprise an electrically insulating second gap surrounding the back contact body between the upper conductive layer and the back contact body, wherein the electrically insulating gap need not extend through the photoactive layer. An important aspect of the above embodiments is that a non-contacting arrangement exists of the back contact body and the upper conductive layer.

In some embodiments the first contact hole may extend through the lower conductive layer and the back contact body may be disposed on the substrate in adhesive engagement therewith. In these embodiments electrically conductive engagement of the back contact body and the lower conductive layer is maintained while adhesion of the back contact body to the layer stack is improved.

SHORT DESCRIPTION OF DRAWINGS

Figure 2:
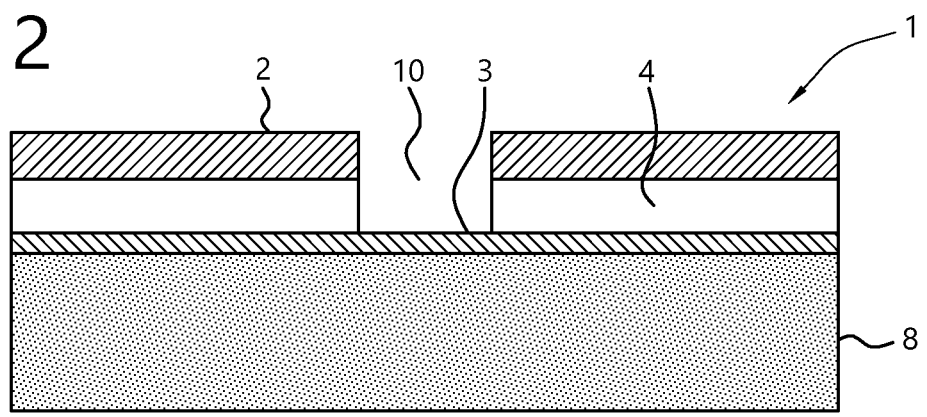
Figure 8:
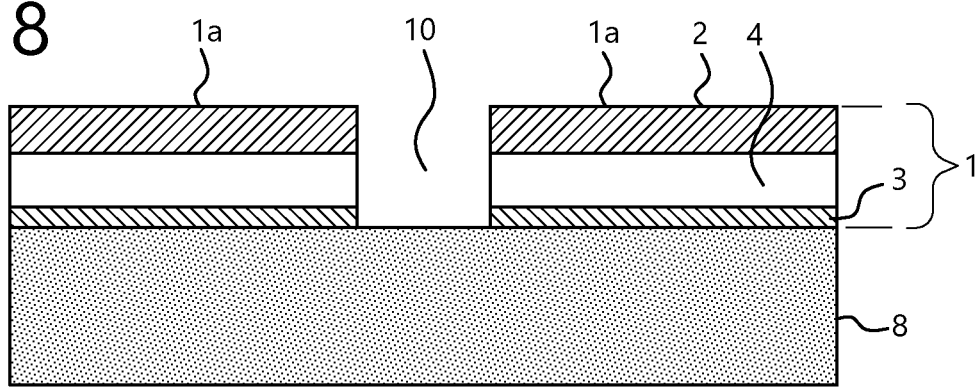
Figure 9:
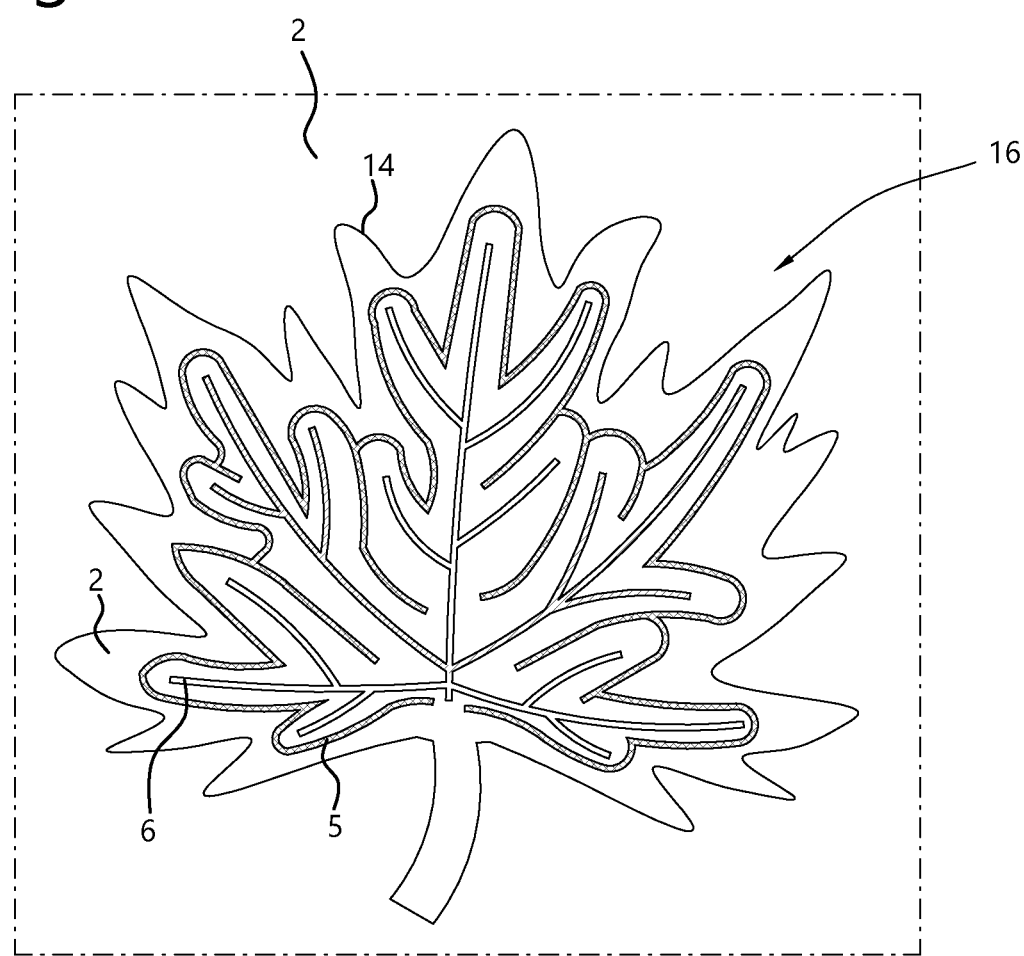

The present invention will be discussed in more detail hereinafter based on a number of exemplary embodiments with reference to the drawings, in which FIG. 1 shows an embodiment of a continuous layer stack according to the present invention;

FIG. 2 shows an embodiment of a contact hole according to the present invention;

FIGS. 3 to 7 each show a respective embodiment of a front and back contact on a layer stack according to the present invention;

FIG. 8 shows an embodiment of an electrical barrier according to the present invention; and FIG. 9 shows an example of a solar cell according to the present invention.

DETAILED DESCRIPTION OF EXEMPLARY EMBODIMENTS

FIG. 1 shows an embodiment of a continuous layer stack according to the present invention. In the embodiment shown, the layer stack 1 is provided on a substrate 8 and comprises an upper conductive layer 2 and a lower conductive layer 3, wherein a photoactive layer 4 is interposed between the upper and lower conductive layer 2, 3. From the depicted layer stack 1 disposed on the substrate 8, a plurality of solar cells is to be manufactured in a high velocity, high yield and sufficiently accurate and reliable production process, preferably through a roll-to-roll (R2R) process. In a group of embodiments the substrate 8 may be transparent, semi-transparent or even opaque to incident light. In an advantageous embodiment the substrate 8 may be a flexible foil, such as PET foil provided on a roll. The upper and lower conductive layer 2, 3 may each comprise a conductive polymer such as PEDOT:PSS, and the photoactive layer 4 may comprise an organic and/or a perovskite photoactive material.

According to the method of the present invention the layer stack 1 may be completed first before a current conductive grid is applied thereto. This is advantageous as various depositing steps for manufacturing the layer stack 1 need not be combined or interrupted with steps relating to depositing particular parts of the current collecting grid, such as one or more contacts thereof. As a result, the manufacturing process of the invention comprises distinct phases that may be optimized separately.

The method of the invention thus begins by a) providing a continuous layer stack 1 on a substrate 8, wherein the layer stack 1 comprises an upper 2 and a lower 3 conductive layer having a photoactive layer 4 interposed there between. In an embodiment the layer stack 1 is obtained through a wet layer structuring process, which is often used for thin film organic and/or perovskite solar cells.

In order to access the upper and lower conductive layer 2, 3 from one side of layer stack 1 for collecting current, the present invention utilizes a contact hole that extends through the upper conductive layer 2 and the photoactive layer 4, wherein the contact hole exposes the lower conductive layer 3.

FIG. 2 shows an embodiment of a first contact hole according to the present invention. In the embodiment shown, a first contact hole 10 in the layer stack 1 allows access to the lower conductive layer 3 from one side of the layer stack 1. In particular, the first contact hole 10 has the advantage that both the upper and lower conductive layer 2, 3 are now accessible from one side of the layer stack 1, thereby simplifying the manufacturing of a current collecting grid in a later stage of the manufacturing process.

The method of the present invention thus further comprises the step of b) selectively removing the upper conductive layer 2 and the photoactive layer 4 for obtaining a first contact hole 10 extending through the upper conductive layer 2 and photoactive layer 4 exposing the lower conductive layer 3.

Selective removal of layer stack material may be accomplished in various ways. For example, in an advantageous embodiment the method step of b) for selectively removing the upper conductive layer 2 and the photoactive layer 4 may comprise selective laser ablation. Using selective laser ablation allows for various shapes of the first contact hole 10. In particular, the first contact hole 10 may be a generally round or circular hole, but it may also be envisaged as a channel traversing through the laser stack 1. Another advantage of selective laser ablation is the speed at which a contact hole can be provided. Selective laser scribing is generally accurate and allows for high scribing speeds, which is advantageous for a fast roll-to-roll process.

Figure 3:
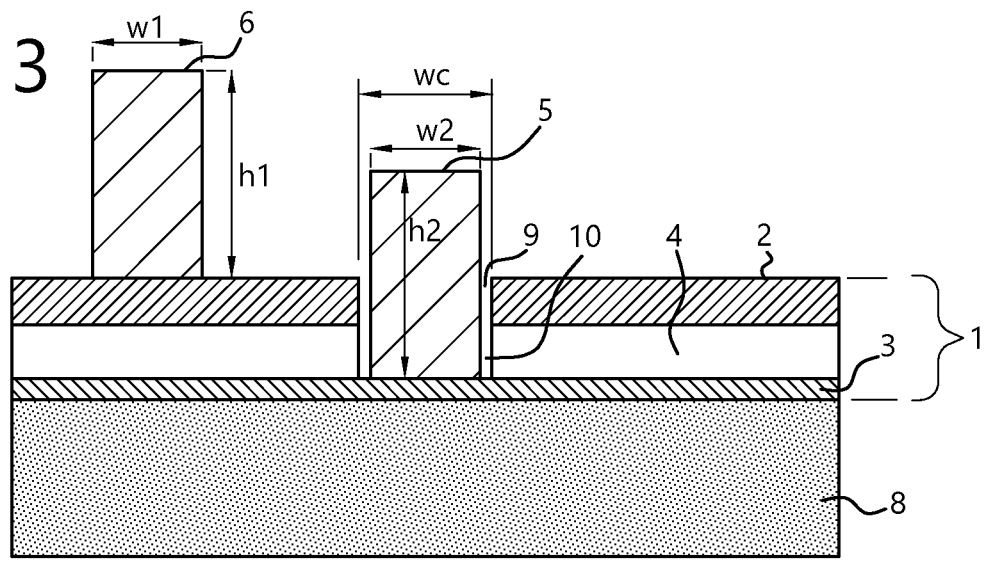

FIG. 3 depicts a final step of the manufacturing process wherein a current collecting grid is deposited on the upper and lower conductive layer 2, 3. The method of the invention further comprises the step of c) printing a front contact body 6 on the upper conductive layer 2 and a back contact body 5 in the first contact hole 10 on the lower conductive layer 3. This printing step is performed in such a way that an electrically insulating first gap 9 is formed surrounding the back contact body 5 between the upper conductive layer 2 and the back contact body 2.

The electrically insulating first gap 9 surrounding the back contact body 5 prevents a direct electrical connection between the lower conductive layer 3 and the upper conductive layer 2, thus essentially preventing a short-circuit there between.

In general terms, the method step of c) for printing a front contact body 6 on the upper conductive layer 2 and a back contact body 5 in the first contact hole 10 on the lower conductive layer 3 provides a non-contacting arrangement between the back contact body 5 and the upper conductive layer 2. The surrounding electrically insulating gap, such as an air gap, is a typical example of such a non-contacting arrangement between the back contact body 5 and the upper conductive layer 2.

The method step of c) yields a front contact body 6 having a width w1 and height h1, and a back contact body 5 having width w2 and height h2. In a typical example the front and back contact body 6, 5 have a substantially square or rectangular cross section as depicted.

In many embodiments the front and back contact 6, 5 may each be envisaged as a narrow, rectangular shaped ridge extending over the upper and lower conductive layer 2, 3.

According to the present invention the front and back contact body 6, 5 may be formed freely across the layer stack 1 and need not be deposited in a regular pattern comprising, for example, parallel disposed straight line front and back contact bodies 6,5. In light of the invention, the front and back contact body 6, 5 may be deposited (e.g. printed) as free-form contours, so as to provide solar cells with a complex, high performance yet aesthetically pleasing current collecting grid.

As mentioned earlier, the first contact hole 10 allows for a one-sided manufacturing process with respect to the layer stack 1 to access the upper and lower conducting layer 2, 3. The method step of c) may thus comprise printing the front and back contact 6, 5 from one side of the layer stack 1, thereby facilitating high speed mechanical automation and improving alignment accuracy of the front and back contact 6, 5 with respect to the layer stack 1.

In a practical embodiment, to increase manufacturing speed and improve alignment of the front and back contact 6,5 with respect to the layer stack 1 even further, the method step of c) may comprise simultaneous printing of the front and back contact body (6, 5). This may be accomplished, for example, through a single printer head or two coupled printer heads disposed adjacent to the layer stack 1, wherein the front and back contact body 6, 5 are printed at substantially the same time. In a further embodiment, the step of c) further comprises forming the front and back contact body 6, 5, to equal height and/or equal width. This may be accomplished by printing the front and back contact body 6, 5 over an equal time interval, so that the height h1 and h2, and/or width w1 and w2, of the front and back contact bodies 6, 5, respectively, have substantially the same value, i.e. $h1 \approx h2$, $w1 \approx w2$.

By varying the width and height ratio (w1/h1, w2/h2) of each of the front and back contact body 6,5, the efficiency and performance of the current collecting grid can be improved. So by increasing the height (h1, h2) and/or width (w1, w2) of the front and back contact 6,5, solar cell performance may be improved.

In FIG. 3 an example is shown on how to obtain an improved performance of the current collecting grid, wherein the step of c) comprises printing the back contact body 5 such that it extends above the upper conductive layer 2.

According to the invention the front and back contact body 6, 5 may be printed onto the layer stack 1. To that end, in an advantageous embodiment, the step of c) may comprise screen printing or inkjet printing the front and/or back contact body 6,5. These printing techniques are reliable, accurate and easily scalable for a roll-to-roll process. In a further embodiment, the step of c) may comprise printing the front and back contact 6,5 using a printing compound comprising at least one of silver (Ag), carbon and carbon nanotubes, which have good electrical conductive properties.

Printing e.g. a silver (Ag) contact body, such as a silver (Ag) front or back contact body 6,5 on a PEDOT upper or lower conductive layer 6,5 may yield a lower performance of the current collecting grid compared to embedded contact bodies within the layer stack 1, e.g. embedded in a PEDOT conductive layer. According to the invention, however, by increasing the width (w1, w2) and/or height (h1, h2) of the front and back contact body 6, 5 respectively, the performance of the current collecting grid need not be an issue and comparable performance to an embedded current collecting grid may be achieved.

Returning to the first contact hole 10, a width wc thereof may be chosen to allow for alignment errors of the back contact body 5 while depositing (e.g. printing) said contact body 5 in the first contact hole 10. In particular, by increasing the width wc with respect to the width w2 of the back contact body 5, various alignment offsets and errors while depositing the back contact body 5 in the first contact hole 10 may be absorbed as the surrounding electrically insulating first gap 9 becomes larger there between, thereby lessening the probability of a short circuit between the upper and lower conductive layer 2, 3 in a high speed manufacturing process. In the embodiment shown in FIG. 3, the back contact body 5 is deposited substantially in the middle of the first contact hole 10, leaving an electrically insulating first gap 9 surrounding the back contact body 5.

Since the present invention seeks to provide a method of manufacturing a current collecting grid for solar cells in a high speed fabrication process, such as roll-to-roll, alignment issues regarding depositing contact bodies on conductive layers cannot be ignored and may even be decisive for the overall quality and performance of the solar cells.

Figure 4:
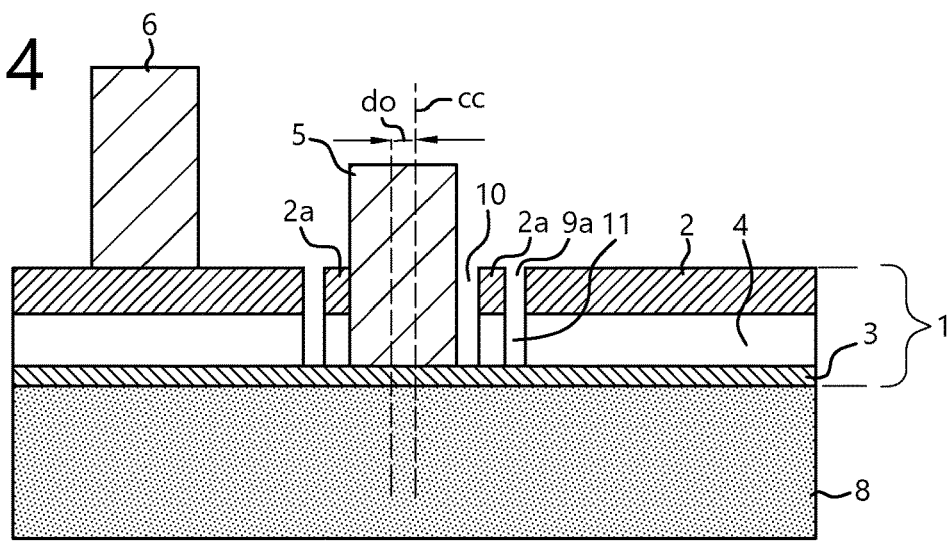

FIG. 4 shows an embodiment of a front and back contact body according to the present invention, wherein possible misalignment issues of the back contact body 5 are further addressed. In the embodiment shown, the back contact body 5 is deposited in the first contact hole 10 with a significant alignment offset do with respect to a centre line cc of the first contact hole 10. In this example the alignment offset is rather extreme such that the back contact body 5 comes into direct contact with a portion of upper conductive layer 2. In order to address such extreme alignment offsets of the back contact body 5, the method step of b) may further comprise selectively removing the upper conductive layer 2 and the photoactive layer 4 for obtaining a second contact hole 11 adjacent to the first contact hole 10. In an embodiment the second contact hole 11 is obtained through selective laser ablation.

In this particular embodiment a second contact hole 11 is formed surrounding the first contact hole 10, thereby providing a further electrically insulating gap 9a surrounding the back contact body 5 between the upper conductive layer 2 and said back contact body 5. The second contact hole 11 adjacent to the first contact hole 10 thus provides a decoupled proximal portion 2a of the upper conductive layer 2, so that the back contact body 5 is in a non-contacting arrangement with the upper conductive layer 2.

From a manufacturing point of view, the first contact hole 10 may be used to guide alignment of e.g. a printer head for printing (depositing) the back contact body 5 on the lower conductive layer 3 in the first contact hole 10. When subjected to high manufacturing speeds, alignment offsets may occur due to timing and positioning lag when executing the method step c).

An added advantage of the embodiment of FIG. 4 is that electrical conductivity and performance of the current collecting grid can be improved by depositing a larger volume (e.g. size) back contact body 5 without risking direct contact between the back contact body 5 and the upper conductive layer 2. Therefore, depositing a back contact body 5 utilizing larger printing (inkjet) volumes is possible without compromising the performance of the current collecting grid.

Figure 5:
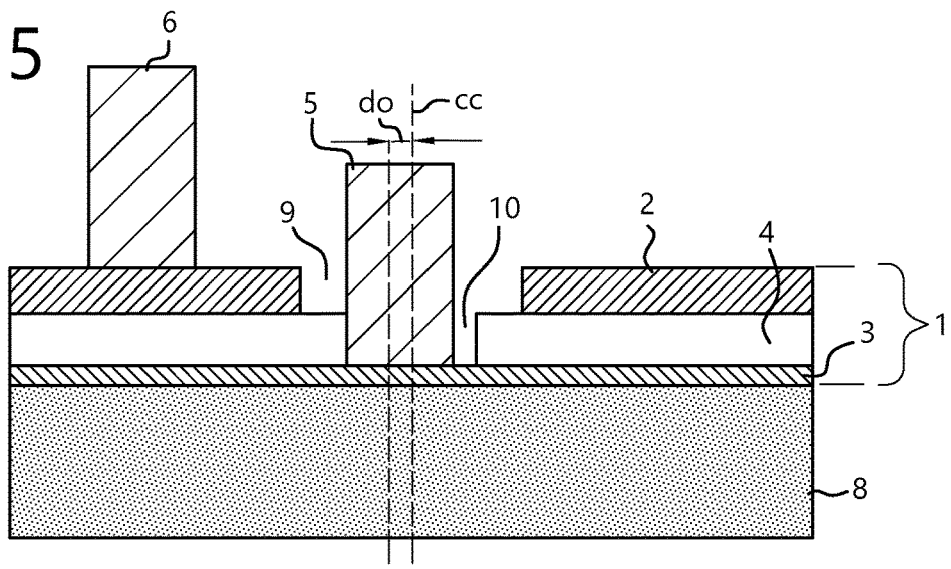

FIG. 5 shows another embodiment of a front and back contact body according to the present invention. In the embodiment shown, an alternative approach to account for alignment offsets of the back contact body 5 is depicted, wherein the first contact hole 10 comprises a widened electrically insulating first gap 9 surrounding the back contact body 5. To obtain this particular embodiment, the method step b) may further comprise selectively removing the upper conductive layer 2 for widening the first contact hole 10 therein. In an embodiment, the widened electrically insulating first gap 9 may be obtained through selective laser ablation.

This embodiment of the method yields a widened electrically insulating first gap 9 surrounding the back contact body 5, so that a relatively large alignment offset do with respect to the centre line cc of the first contact hole 10 can be absorbed during high speed printing. The non-contacting arrangement of the back contact body 5 and the upper conductive layer 2 is therefore maintained.

Figure 6:
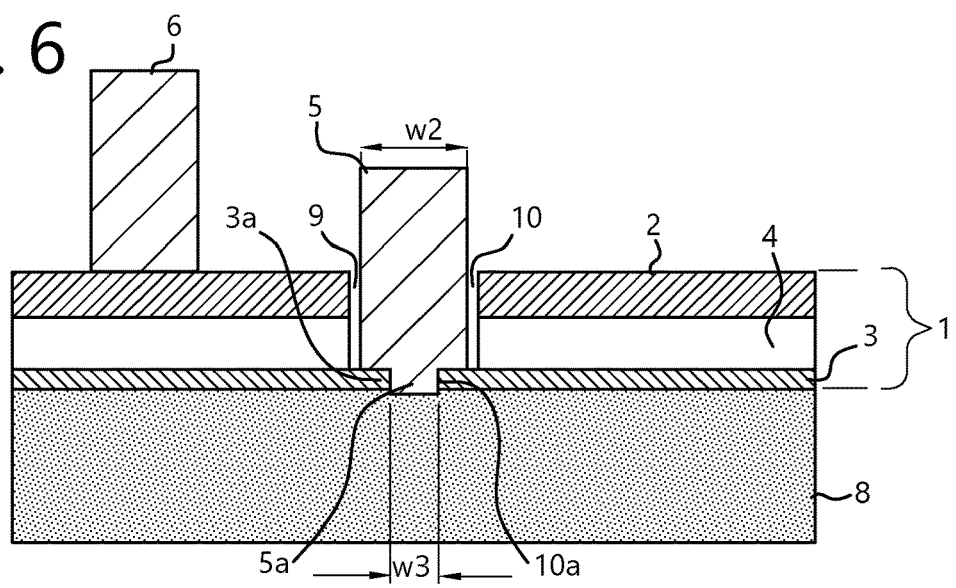

FIG. 6 depicts another embodiment of the front and back contact body 6, 5 of the present invention. In the embodiment shown, the first contact hole 10 also extends through the lower conductive layer 3 up to the substrate 8. As depicted, the first contact hole 10 comprises an end portion 10a having a smaller width that the width w2 of the back contact body 5. Congruently, an end portion 5a of the back contact body 5 has a width w3 smaller than the width w2 of the back contact body 5, wherein the end portion 5a thereof is disposed in the end portion 10a of the first contact hole 10. The back contact body 5 is disposed on a rim part 3a of the lower conductive layer 3 for electrical conductivity. So in general a main part of the first contact hole 10 extends through the upper conductive layer 2 and the photoactive layer 4, wherein the main part is wider than a secondary part of the first contact hole 10, wherein the secondary part extends through the lower conductive layer 3.

This particular embodiment may be obtained by the method step of b) that may further comprise selectively removing the lower conductive layer 3 for extending the first contact hole 10 there through.

This embodiment is advantageous for improving adhesion of the back contact body 5 to the layer stack 1, wherein the back contact body 5 is in part deposited (e.g. printed) on the substrate 8 and in adhesive engagement therewith. As in other embodiments, the electrically insulating first gap 9 surrounding the back contact 5 prevents a direct electrical connection between the back contact body 5 and the upper conductive layer 2, thus providing the non-contacting arrangement thereof. The electrically insulating first gap 9 further improves robustness against possible alignment offset of the back contact body 5 with respect to the first contact hole 10 as explained above.

Figure 7:
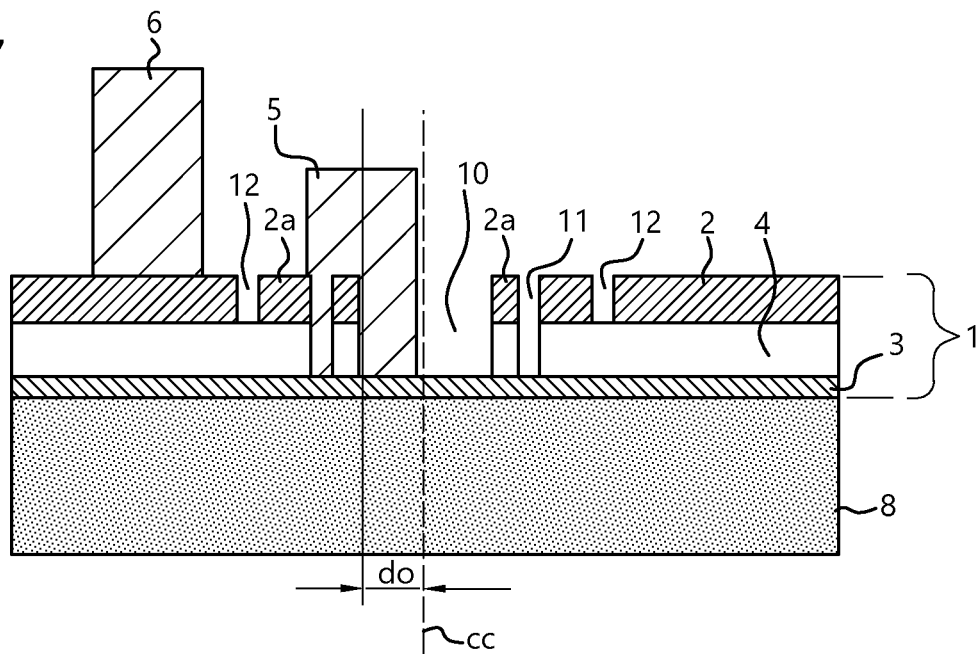

In FIG. 7 yet another embodiment of the front and back contact body 6, 5 in the layer stack 1 is depicted. In this embodiment, further improvements are made to account for alignment offset of the back contact body 5. In the embodiment shown, the back contact body 5 is disposed from the centre line cc with a distance do. In this particular example, the alignment offset do is so extreme that the back contact body 5 is in part disposed in the second contact hole 11 and in contact with the decoupled proximal portion 2a of the upper conductive layer 2. In a more controlled manufacturing process, the alignment offset would be significantly smaller, so that the back contact body 5 would be disposed within the confines of the first contact hole 10.

In order to prevent a direct electrical connection between the back contact body 5 and the upper conductive layer 2, an electrically insulating second gap 12 surrounds the back contact body 5 for providing the non-contacting arrangement between the back contact body 5 and the upper conductive layer 2.

According to the invention, the first contact hole 10 is arranged for providing access to the lower conducting layer 2 from one side of the layer stack 1. This is advantageous in light of the fact that the layer stack 1 can then be produced first, wherein manufacturing steps relating to e.g. layer structuring, wet solution based processing etc. need not be combined with manufacturing steps and requirements thereof for providing a current collecting grid, i.e. the front and back contact body 6, 5. Therefore, separating the manufacturing of the layer stack 1 on substrate 8 and subsequently manufacturing the front and back contact bodies 6,5 greatly facilitates a high speed, high yield roll-to-roll (R2R) manufacturing process of solar cells.

As mentioned hereinbefore, the first and/or second contact holes 10, 11 may be provided through selective removal using, for example, selective laser ablation for scribing the first and/or second contact hole 10,11. The depth of said holes 10, 11 is of course dependent on a particular time period over which the layer stack 1 is subjected to the selective removal method step, as well as on a removal intensity of the laser ablation process (e.g. pulsed laser, continuous laser, laser power etc.).

Now, in order to define a solar cell, in particular an outer perimeter thereof, selective removal may also be used to create a hole or channel fully extending through the layer stack 1, so that an electrically insulating perimeter or barrier is obtained between the upper and lower conductive layer 2, 3.

In FIG. 8 an embodiment of an electrical barrier according to the present invention is depicted. In the embodiment shown, a selective removal step is performed for creating a hole or channel 14 extending through all layers of the layer stack 1 and in which the substrate 8 is exposed. In this case no printing step is performed for depositing a back contact body in the hole or channel 14. Instead, the hole or channel 14 now defines an electrically insulating barrier between two parts 1a of the layer stack 1. The selective removal step may comprise selective laser ablation with appropriate duration and intensity for removing layer stack material. The selective laser ablation may be performed through a laser scribing process to obtain a free-form contour of an electrically insulating barrier for a solar cell.

FIG. 9 shows a top view of an example of a solar cell according to an embodiment of the present invention. In the embodiment shown the hole or channel 14 is depicted as an electrically insulating barrier defining an outer perimeter of a leave shaped solar cell 16. Within the confines of the electrically insulating perimeter defined by the hole or channel 14, a current collecting grid is depicted comprising the front and back contact bodies 6,5. The front and back contact body 6, 5 may each comprise a free-formed ridge extending over the upper and lower conductive layer 2,3. Since the method step of c) printing the front and back contact body 6,5 may be performed using inkjet printing or screen printing, a free-formed current collecting grid can be manufactured from one side of the layer stack 1.

According to the invention as depicted in FIG. 9, solar cells obtained through the method of the present invention may have free formed shapes, such as shapes for decorative and/or artistic purposes. Embodiments of a thin film solar cell 16 wherein the substrate 8 comprises e.g. a thin (semi-)transparent foil and the layer stack 1 comprises (semi-)transparent upper and lower conductive layers 2,3, and a (semi-) transparent photoactive layer 4, may be placed on e.g. glass surfaces.

The method of the present invention thus provides a way for fast, large quantity manufacturing of solar cells not just for functionality, i.e. generating usable electricity, but such solar cells may also fulfill a decorative or artistic purpose. So a host of additional placement options and locations are possible. That is, in addition to placing free formed solar cells according to the present invention on rooftops, inner or outer wall surfaces, window surfaces, furniture surfaces, vehicle surfaces, roof tile surfaces etc. can now be provided with such free formed solar cells.

In a further aspect the present invention relates to a thin film organic solar cell that can be manufactured in a fast roll-to-roll process. Reference is made to all FIGS. 1 to 9.

The thin film organic solar cell of the present invention comprises a layer stack 1 disposed on a flexible substrate 8. The layer stack 1 comprises an upper 2 and a lower 3 conductive layer having a photoactive layer 4 interposed there between. A first contact hole 10 is provided in the layer stack 1 extending through the upper conductive layer 2 and photoactive layer 4. The thin film organic solar cell further comprises a current collecting grid comprising a front contact body 6 disposed on the upper conductive layer 2 and a back contact body 5 disposed on the lower conductive layer 3 in the first contact hole 10. An electrically insulating gap 9 surrounds the back contact body 5 between the upper conductive layer 2 and back contact body 5.

The advantage of the thin film organic solar cell 16 according to the invention is that the current collecting grid is disposed on the layer stack 1 from one side thereof instead of being embedded therein. As a result, the solar cell 16 allows a two-phase manufacturing process, whereby in a first phase the layer stack 1 is manufactured first, followed by a second phase comprising depositing the current collecting gird, i.e. the front and back contact body 6, 5.

Furthermore, since there is a non-contacting arrangement of the back contact body 5 and the upper conductive layer 2, a direct electrical connection there between is prevented. The non-contacting arrangement is typically embodied as an electrically insulating gap 9, which allows for alignment offsets of the back contact body 5 with respect to the first contact hole 10 without compromising the non-contacting arrangement. This facilitates a high speed manufacturing process, in particular a roll-to-roll manufacturing process.

In an embodiment, the front contact body 6 and the back contact body 5 may be of equal length, which improves performance of the solar cell and simplifies depositing the front and back contact body 6, 5.

The thin film organic solar cell 16 may further comprise a second contact hole 11 adjacent to the first contact hole 10. The second contact hole 11 extends through the upper conductive layer 2 and the photoactive layer 4. The second contact hole 11 allows for larger alignment offsets of the back contact body 5 in the first contact hole 10.

In an embodiment, the first contact hole 10 may extend through the lower conductive layer 3, wherein the back contact body 5 is disposed on the substrate 8 in adhesive engagement therewith. This embodiment improves adhesion of the back contact body 5 to the layer stack 1.

Instead of having contact holes extending through the upper conductive layer 2 and the photoactive layer 4 for preventing a direct electrical connection between the back contact body 5 and the upper conductive layer 2, the thin film organic solar cell 16 may comprise an electrically insulating second gap 12 extending through the upper conductive layer 2 and surrounding the back contact body 5 between the upper conductive layer 2 and the back contact body 5. This embodiment may be employed to account for the most inaccurate positioning of the back contact body 5 during fast roll-to-roll manufacturing.

The present invention can now be summarized by the following embodiments:

Embodiment 1. Method of making a current collecting grid for solar cells, comprising the steps of a) providing a continuous layer stack (1) on a substrate (8), the layer stack (1) comprising an upper (2) and a lower (3) conductive layer having a photoactive layer (4) interposed there between;

b) selectively removing the upper conductive layer (2) and the photoactive layer (4) for obtaining a first contact hole (10) extending through the upper conductive layer (2) and photoactive layer (4) exposing the lower conductive layer (3);

c) printing a front contact body (4) on the upper conductive layer (2) and a back contact body (5) in the first contact hole (10) on the lower conductive layer (3) and forming an electrically insulating first gap surrounding the back contact body (5) between the upper conductive layer (2) and the back contact body (2).

Embodiment 2. Method according to embodiment 1, wherein the step of c) comprises printing the front and back contact (6, 5) from one side of the layer stack (1).

Embodiment 3. Method according to embodiment 1 or 2, wherein the step of c) comprises printing the front and back contact body (6, 5) simultaneously.

Embodiment 4. Method according to any one of embodiments 1 to 3, wherein the step of b) comprises further selectively removing the upper conductive layer (2) for widening the first contact hole (10) therein.

Embodiment 5. Method according to any one of embodiments 1 to 4, wherein the step of b) further comprises selectively removing the lower conductive layer (3) for extending the first contact hole (10) there through.

Embodiment 6. Method according to embodiment 5, wherein a main part of the first contact hole (10) extending through the upper conductive layer (2) and the photoactive layer (4) is wider than a secondary part of the first contact hole (10) extending through the lower conductive layer (3).

Embodiment 7. Method according to any one of embodiments 1 to 6, wherein the method step of b) further comprises selectively removing the upper conductive layer (2) and the photoactive layer (4) for obtaining a second contact hole (11) adjacent to the first contact hole (10).

Embodiment 8. Method according to embodiment 7, wherein the method step of b) further comprises selectively removing the upper conductive layer (2) for obtaining an electrically insulating second gap (12) surrounding the second contact hole (10), wherein the electrically insulating second gap (12) extends through the upper conductive layer (2) exposing the photoactive layer (4).

Embodiment 9. Method according to anyone of embodiments 1 to 8, wherein the step of c) further comprises forming the front and back contact body (6, 5) to equal height and/or equal width.

Embodiment 10. Method according to any one of embodiments 1 to 9, wherein the step of c) further comprises printing the back contact body (5) such that it extends above the upper conductive layer (2).

Embodiment 11. Method according to any one of embodiments 1 to 10, wherein the step of b) selectively removing the upper conductive layer (2) and the photoactive layer|(4) comprises selective laser ablation.

Embodiment 12. Method according to any one of embodiments 1 to 11, wherein the step of c) comprises screen printing or inkjet printing the front and/or back contact body (6,5).

Embodiment 13. Method according to any one of embodiments 1 to 12, wherein the step of c) comprises printing the front and back contact (6,5) using a printing compound comprising at least one of silver, carbon and carbon nanotubes.

Embodiment 14. Method according to any one of embodiments 1-13, wherein each of the upper (2) and lower (3) conductive layer comprises a conductive polymer, and wherein the photoactive layer (4) comprises organic material and/or perovskite.

Embodiment 15. Method according to any one of embodiments 1-14, wherein the substrate (8) is a flexible substrate comprising a plastic foil.

Embodiment 16. Thin film organic solar cell comprising a layer stack (1) disposed on a flexible substrate (8), the layer stack (1) comprising an upper (2) and a lower (3) conductive layer having a photoactive layer (4) interposed there between;
a first contact hole (10) in the layer stack (1) extending through the upper conductive layer (2) and photoactive layer (4); and a current collecting grid comprising
a front contact body (6) disposed on the upper conductive layer (2) and a back contact body (5) disposed on the lower conductive layer (3) in the first contact hole (10), wherein an electrically insulating gap surrounds the first contact hole (10) between the upper conductive layer (2) and the first contact hole (10).

Embodiment 17. Thin film organic solar cell according to embodiment 16, wherein the front contact body (6) and the back contact body (5) are of equal width and/or height.

Embodiment 18. Thin film organic solar cell according to embodiment 16 or 17, wherein the solar cell (16) comprises a second contact hole (11) adjacent to the first contact hole (10), the second contact hole (11) extending through the upper conductive layer (2) and the photoactive layer (4).

Embodiment 19. Thin film organic solar cell according to any one of embodiments 16 to 18, wherein the first contact hole (10) extends through the lower conductive layer (3) and the back contact body (5) is disposed on the substrate (8) in adhesive engagement therewith.

Embodiment 20. Thin film organic solar cell according to any one of embodiments 16 to 19, comprising an electrically insulating second gap (12) surrounding the back contact body (5) between the upper conductive layer (2) and the back contact body (5).

The embodiments of the present invention have been described above with reference to a number of exemplary embodiments as shown in and described with reference to the drawings. Modifications and alternative implementations of some parts or elements are possible, and are included in the scope of protection as defined in the appended claims.

The invention claimed is:

1. A method of making a current collecting conductive pattern on one side of a layer stack of a thin film solar cell, comprising the steps of
   a) providing the layer stack on a flexible substrate foil, the layer stack comprising an upper and a lower conductive layer having a photoactive layer therebetween, and the lower conductive layer being adjacent to the flexible substrate foil;
   b) selectively removing a portion of the upper conductive layer and the photoactive layer for obtaining a first contact hole extending through the upper conductive layer and photoactive layer exposing the lower conductive layer;
   c) printing a front contact body on the remaining portion of the upper conductive layer and a back contact body in the first contact hole on the exposed lower conductive layer, thereby forming a first current collecting contact body on the remaining portion of the upper conductive layer and a second current collecting contact body on the lower conductive layer, and forming a first gap partially surrounding the back contact body between the remaining portion of the upper conductive layer and the back contact body,
   wherein the front contact body and back contact body are printed from the one side of the layer stack,
   wherein the first current collecting contact body and the second current collecting contact body are electrically insulated from each other, and step b) further comprises creating a second contact hole surrounding the first contact hole so as to obtain a second gap between a main section of the remaining portion of upper conductive layer and the back contact body by selectively removing the remaining portion of the upper conductive layer and the remaining portion of the photoactive layer, wherein the second gap surrounds the first contact hole, thereby providing a decoupled proximal portion of the remaining portion of the upper conductive layer proximal to the back contact body and separated from the main section of the remaining portion of the upper conductive layer; wherein the decoupled proximal portion is located between the first contact hole and the surrounding second gap, and the second gap provides an electrically non-contacting arrangement of the back contact body printed in the first contact hole on the lower conductive layer in step c) and the main section of the upper conductive layer.

2. The method according to claim 1, wherein the step of c) comprises printing the front and back contact body from the one side of the layer stack.

3. The method according to claim 1, wherein the front contact body and back contact body are printed simultaneously.

4. The method according to claim 1, wherein the step of c) further comprises forming the front and back contact body to equal height and/or equal width.

5. The method according to claim 1, wherein the step of c) further comprises printing the back contact body such that it extends above the upper conductive layer.

6. The method according to claim 1, wherein the step of b) selectively removing the upper conductive layer and the photoactive layer comprises selective laser ablation.

7. The method according to claim 1, wherein the step of c) comprises screen printing or inkjet printing the front and/or back contact body.

8. The method according to claim 1, wherein the step of c) comprises printing the front and back contact body using a printing compound comprising at least one of silver, carbon and carbon nanotubes.

9. The method according to claim 1, wherein each of the upper and lower conductive layer comprises a conductive polymer, and wherein the photoactive layer comprises organic material and/or perovskite.

10. The method according to claim 1, wherein the flexible substrate foil comprises a plastic foil.

11. The method according to claim 1, wherein the first current collecting contact body on the upper conductive layer and the second current collecting contact body on the lower conductive layer are shaped as free-formed contours.

12. The method according to claim 1, wherein the front contact body and back contact body are printed at substantially the same time.

13. A roll-to-roll process for manufacturing thin film solar cells, wherein each thin film solar cell is made according to the method of claim 1.

* * * * *